United States Patent [19]

Kennedy

[11] 4,277,757
[45] Jul. 7, 1981

[54] TWO STAGE RF AMPLIFIER

[75] Inventor: Richard A. Kennedy, Russiaville, Ind.

[73] Assignee: General Motors Corporation, Detroit, Mich.

[21] Appl. No.: 100,470

[22] Filed: Dec. 5, 1979

[51] Int. Cl.³ .......................... H03F 3/16; F03F 3/193
[52] U.S. Cl. ................................... 330/300; 330/285; 330/311
[58] Field of Search .................... 330/285, 300, 311

[56] References Cited

U.S. PATENT DOCUMENTS

| 3,177,439 | 4/1965 | Tulp | 330/285 |
| 3,510,579 | 5/1970 | Marsh | 330/285 |

OTHER PUBLICATIONS

Texas Instruments Application Report "AGC Characteristics of FET Amplifiers" p. 7, Figure 11.

Primary Examiner—James B. Mullins
Assistant Examiner—Gene Wan
Attorney, Agent, or Firm—Robert M. Sigler

[57] ABSTRACT

A radio frequency amplifier includes a first stage cascode combination of a JFET and a bipolar transistor with a second stage bipolar transistor coupled to the first stage bipolar transistor through a tuned circuit. An AGC voltage is applied to the base of the second stage bipolar transistor, the emitter of which is connected in series with the base of the first stage bipolar transistor. The second stage bipolar transistor thus acts both as a second stage RF amplifier and an AGC signal amplifier for the first stage.

1 Claim, 1 Drawing Figure

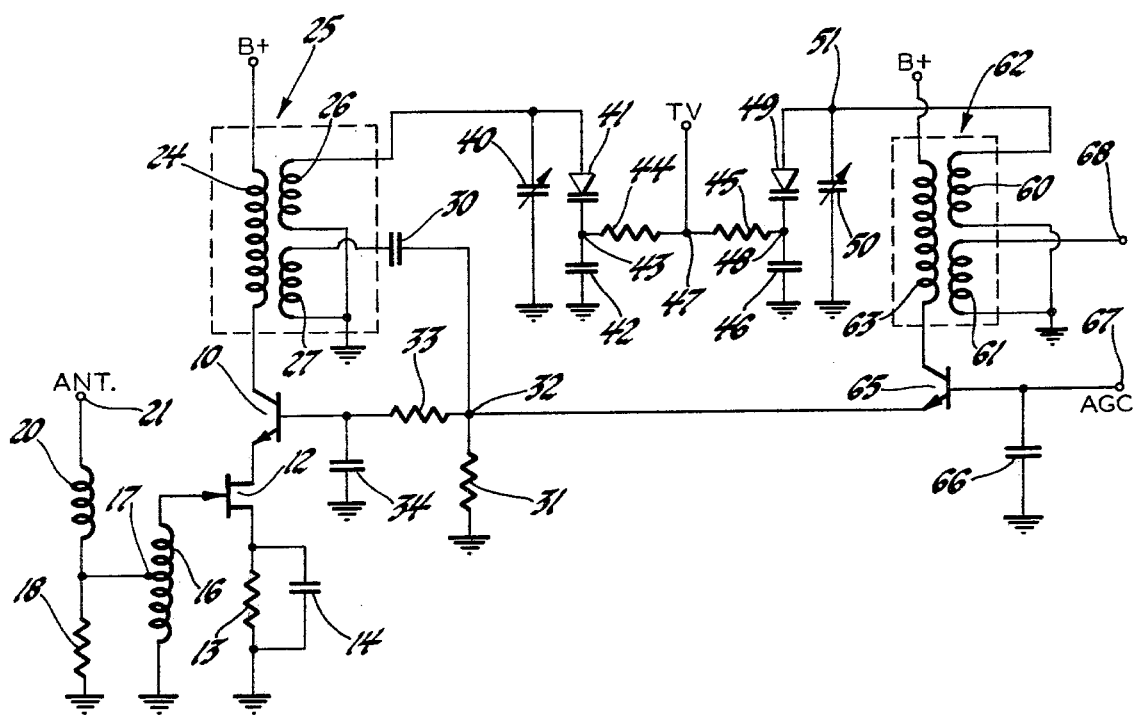

TWO STAGE RF AMPLIFIER

BACKGROUND OF THE INVENTION

This invention relates to radio frequency amplifiers and particularly to those utilizing automatic gain control. Such amplifiers are commonly used in the initial amplification of a received radio frequency signal, particularly in AM receivers.

An RF amplifier which has been utilized in a significant number of radio receivers since its introduction is the dual gate MOSFET, in which the RF signal may be aplied to the lower gate and a gain control voltage applied to the upper gate. The gain controlled output is obtained from the drain of the device. However, although useful, the dual gate MOSFET RF amplifier has limitations in AGC range and overload characteristics.

An improved RF amplifier which may replace a dual gate MOSFET in many circuit applications is a cascode combination of a JFET and bipolar transistor. The drain of the JFET is connected to the emitter of the bipolar transistor; the RF signal is applied to the gate of the JFET; the AGC voltage is applied to the base of the bipolar transistor; and the output is taken from the collector of the bipolar transistor. This amplifier shows superior AGC range and overload characteristics under applied AGC; and, in addition, provides simpler biasing requirement and lower noise than a dual gate MOSFET. However, the bipolar transistor of the combination requires a base current for operation which is considerably greater than the leakage gate current of the upper gate of a dual gate MOSFET. Therefore, if this cascode amplifier is to be substituted directly for a dual gate MOSFET in a circuit application, a larger current drive must be supplied for the bipolar transistor.

In addition, it may be desirable, particularly in some varactor tuned applications, to provide a second stage of RF amplification in order to overcome losses in the tuning circuit without overloading the tuning varactor diodes.

SUMMARY OF THE INVENTION

It is, therefore, an object of this invention to provide a gain controlled RF amplifier utilizing a cascode JFET-bipolar transistor combination with adequate drive current applied to the bipolar transistor base.

It is yet another object of this invention to provide a gain controlled RF amplifier utilizing a cascode JFET-bipolar transistor pair and further having a second bipolar transistor stage.

These objects are realized in a circuit which includes a cascode JFET-bipolar amplifier having a second bipolar transistor stage with its emitter connected to the base of the bipolar transistor of the cascode pair, its base provided with an AGC voltage and its collector coupled to the collector of the bipolar transistor of the cascode pair through a tuned circuit. The second bipolar transistor stage thus serves, at the tuned radio frequency, as an additional signal amplification stage and further serves as an essentially DC current amplifier for the AGC signal to the cascode amplifier pair. The second stage bipolar transistor is biased to operate at a much lower current level than the first stage cascode amplifier, so that its bias may be controlled by the AGC voltage directly. Thus the advantages of a cascode JFET-bipolar amplifier combination plus a second stage amplifier are obtained by the addition of a single bipolar transistor.

BRIEF DESCRIPTION OF THE DRAWINGS

Further details and advantages of this invention will be apparent from the accompanying drawing and following description of a preferred embodiment.

DESCRIPTION OF THE PREFERRED EMBODIMENT

Referring to the drawing, a bipolar transistor 10 has its emitter connected to the drain of a JFET 12. The connection may be direct as shown or may be through a resistor having a small value such as 27 ohms. The small resistor provides added protection, if desired, against cross modulation distortion from a strong signal at a frequency near the tuned frequency in an AM radio application. The source of JFET 12 is connected through the parallel combination of a resistor 13 in capacitor 14 to ground. The gate of JFET 12 is connected through a tapped inductor 16 to ground; while the tap 17 of inductor 16 is connected through a resistor 18 to ground and an inductor 20 to an antenna terminal 21. Resistor 13 is used for temperature stability, capacitor 14 for grounding of the JFET source and elements 16 through 20 for impedance matching between JFET 12 and an antenna, all in a conventional manner.

The collector of bipolar transistor 10 is connected through an inductor 24 to an electric power supply at a substantially constant voltage of, for example, eight volts relative to ground. Inductor 24 forms the primary of a transformer 25 having a pair of secondary inductors 26 and 27. Each of inductors 26 and 27 has one end grounded and is wound in the same direction relative to primary inductor 24. Inductor 27 has its other end connected through a capacitor 30 and resistor 31 to ground. Junction 32 between capacitor 30 and resistor 31 is further connected through a resistor 33 to the base of transistor 10, which base is connected through a capacitor 34 to ground.

Inductor 26 has its other end connected through a variable capacitor 40 to ground and further through a varactor diode 41 and capacitor 42 in series to ground. Junction 43 between varactor 41 and capacitor 42 is connected through the series combination of the resistor 44, resistor 45 and capacitor 46 to ground. A junction 47 between resistors 44 and 45 is connectable to a source of tuning voltage, not shown; and a junction 48 between resistor 45 and capacitor 46 is connected to another varactor diode 49. A variable capacitor 50 is connected in parallel across the series combination of varactor diode 49 and capacitor 46.

Junction 51 between varactor diode 49 and variable capacitor 50 is connected through an inductor 60 to ground. Inductor 60 and similar inductor 61 are both associated as secondary windings of a transformer 62 having a primary winding 63 connected between power source plus B and the collector of an NPN bipolar transistor 65. Transistor 65 has an emitter connected to junction 32 of resistors 33 and 31 and a base connected through a capacitor 66 to ground and also to a source of AGC voltage at a terminal 67. Secondary inductor 61 has an ungrounded end defining a terminal 68 on which appears the output signal of the amplifier.

Transformer 25 and capacitive elements 40–42 comprise a first RF tuned circuit which is coupled between the cascode combination of transistors 10 and 12 and transistor 65, the actual RF signal path being through inductor 27 and capacitor 30. Transformer 62 and capacitive elements 46, 49 and 50 comprise a second tuned circuit coupled to transistor 65 and tuned to the same radio frequency as the first tuned circuit by tuning voltage TV.

The AGC voltage applied to the base of transistor 65 determines the operating point of this transistor. The resulting emitter current through resistors 31 and 33 and the base emitter junction of transistor 10 determines the operating point of transistor 10 and thus the gain of the cascode combination of transistors 10 and 12. The DC current amplification provided by transistor 65 ensures sufficient base current to transistor 10; whereas transistor 65 itself requires a smaller base current which can easily be delivered by the source of AGC voltage. Since the gain requirement of transistor 65 is small, it is operated common base. The impedances of transistor 65 and inductor 27 are mismatched to optimize linearity of transistor 65 while optimizing the Q of the first tuned circuit. This makes its gain insensitive to its bias current down to some relatively low level, so that its gain stays nearly constant during the early position of the total AGC voltage range.

Appropriate circuit values for a preferred embodiment are listed below:

transistors and diodes:
   10, 65—Delco Specification DS-66
   12—National J310
   41, 49—Delco Specification DS-123
resistors:
   13–100
   18, 44, 45–100K
   31–3.3K
   33–1K
capacitors:
   14, 34, 42, 46–0.1
   30–0.05
   66–1 transformers:
   Delco part number 16006685

Although the described embodiment is preferred, many equivalent embodiments exist; and the invention should therefore be limited only by the claim which follows.

The embodiments of the invention in which an exclusive property or privilege is claimed are defined as follows:

1. A radio frequency amplifier comprising, in combination:
   a first stage comprising a common source JFET having source, gate and drain in cascade combination with a first common base bipolar transistor having emitter, base and collector, the JFET gate comprising an RF input to the amplifier;
   a second stage comprising a second common base bipolar transistor having emitter, base and collector, the collector comprising an RF output for the amplifier;
   a tuned circuit coupling the first and second stages at a predetermined RF frequency; whereby an RF signal path is provided between the amplifier input and output with gain in each stage;
   means effective to establish an AGC voltage on the base of the second bipolar transistor, whereby the gain of the second stage is controlled in accordance with the AGC voltage;
   means connecting the emitter of the second bipolar transistor in series with the base of the first bipolar transistor, whereby the second bipolar transistor is effective to provide amplified direct drive current for the first bipolar transistor and thus control the gain of the first stage in accordance with the AGC voltage, the second bipolar transistor thus providing amplification simultaneously for RF and AGC signals.

* * * * *

UNITED STATES PATENT AND TRADEMARK OFFICE
CERTIFICATE OF CORRECTION

PATENT NO. : 4,277,757
DATED : July 7, 1981
INVENTOR(S) : Richard A. Kennedy

It is certified that error appears in the above-identified patent and that said Letters Patent are hereby corrected as shown below:

Column 3, line 22, "position" should read -- portion --.

Column 4, claim 1, line 13, "cascade" should read -- cascode --.

Signed and Sealed this

Eighth Day of December 1981

[SEAL]

Attest:

GERALD J. MOSSINGHOFF

Attesting Officer     Commissioner of Patents and Trademarks